United States Patent [19]

Abe et al.

[11] 4,454,166

[45] Jun. 12, 1984

[54] PROCESS FOR PREPARING SEMICONDUCTOR DEVICE

[75] Inventors: Haruhiko Abe, Itami; Hiroshi Harada, Kawanishi; Shigeji Kinoshita, Itami; Yoshihiro Hirata, Amagasaki; Masahiko Denda; Yoichi Akasaka, both of Itami, all of Japan

[73] Assignee: Mitsubishi Denki Kabushiki Kaisha, Tokyo, Japan

[21] Appl. No.: 455,251

[22] Filed: Jan. 3, 1983

Related U.S. Application Data

[63] Continuation of Ser. No. 176,103, Aug. 7, 1980, abandoned.

[30] Foreign Application Priority Data

Sep. 17, 1979 [JP] Japan .................................. 54-119522

[51] Int. Cl.³ .......................................... H01L 21/283
[52] U.S. Cl. ......................................... 427/85; 427/90; 427/93; 427/94; 427/95; 427/39
[58] Field of Search ..................................... 427/93-95, 427/88-90, 85, 96, 39; 430/314

[56] References Cited

U.S. PATENT DOCUMENTS

| | | | |
|---|---|---|---|
| 4,283,439 | 8/1981 | Higashinakagawa | 427/93 |
| 4,321,284 | 3/1982 | Yakushiji | 427/90 |
| 4,330,569 | 5/1982 | Gulett | 427/38 |

OTHER PUBLICATIONS

Kern et al., "Advances in Deposition Processes for Passivating Films", J. Vac. Sci. Technol., vol. 14, No. 5, Sep./Oct. 1977, pp. 1082-1099.

*Primary Examiner*—John D. Smith
*Attorney, Agent, or Firm*—Oblon, Fisher, Spivak, McClelland & Maier

[57] ABSTRACT

A nitride film is formed on a main surface of a semiconductor substrate by plasma CVD process and an oxygen-containing layer is formed on the nitride film and an aluminum-containing film is further formed on the oxygen-containing layer.

6 Claims, 4 Drawing Figures

PROCESS FOR PREPARING SEMICONDUCTOR DEVICE

This is a continuation of application Ser. No. 176,103, filed Aug. 7, 1980 now abandoned.

BACKGROUND OF THE INVENTION

1. Field of the Invention

The present invention relates to a process for preparing a semiconductor device. More particularly, it relates to an improvement of a process for forming an aluminum-containing film on a nitride film formed by a plasma enhanced chemical vapor deposition (plasma CVD nitride film).

2. Description of the Prior Arts

The prior arts of the present invention will be described for one embodiment of a preparation of a multi-layer wiring film for a large scale integrated circuit (LSI).

FIG. 1 shows a sectional view of only wiring parts of the conventional LSI after forming a pattern of a two layer wiring. In FIG. 1, the reference numeral (1) designates a silicon substrate (Si); (2) designates an oxidized film ($SiO_2$); (3) designates a first layer of an aluminum wiring film; (4) designates a plasma CVD nitride film; (5) designates a through-hole; (6) designates a second layer of an aluminum wiring film.

After forming the first layer of the aluminum wiring film (3), the plasma CVD nitride film (4) is formed and the through-hole (5) is formed and then, the second layer of the aluminum wiring film (6) is formed on the plasma CVD nitride film (4) and the through-hole by a metal vapor deposition, etc. In such structure, there is large possibility for a failure caused by a short-circuit between the first layer of the aluminum wiring film (3) and the second layer of the aluminum wiring film (6). This is caused by a local structural defect such as pin-holes formed in the plasma CVD nitride film or a short-circuit between both the aluminum wiring films (3) and (6) which is resulted by partially reacting the plasma CVD nitride film (4) with the second layer of the aluminum wiring film (6) as shown as A in FIG. 1. This has been confirmed by the following tests.

The first layer of the aluminum film (3) is formed on the silicon substrate (1), and the plasma CVD nitride film (4) is formed on the aluminum film (3). The second layer of the aluminum film (6) is formed on the nitride film to prepare a sample. The sample is heat-treated in a nitrogen atmosphere at 500° C. Variations of element distribution in the sample to the depth direction before and after the heat-treatment are measured by an auger electron spectroscopy.

FIG. 2 shows the results of the auger electron spectroscopy wherein depths from the surface of the second layer of the aluminum film (6) is plotted on the abscissa and auger electron intensities as relative contents of the elements in the depths are plotted on the ordinate. The full line shows the distribution before the heat-treatment and the broken line shows the distribution after the heat-treatment. In FIG. 2, the reference (a) corresponds to the oxygen; (b) corresponds to aluminum in the second layer of the aluminum film (6); (c) corresponds to nitrogen in the plasma CVD nitride film (4); (d) corresponds to oxygen; (e) corresponds to aluminum corresponding to the first layer of the aluminum film (3); (b') and (e') respectively show variations after the heat-treatment which correspond to the curves (b) and (e).

This result shows the fact that the aluminum in the second layer of the aluminum film (6) is easily diffused into the plasma CVD nitride film (4) by the heat-treatment. On the other hand, the first layer of the aluminum film (3) is not substantially diffused into the plasma CVD nitride film (4). This reason is considered that the alumina layer formed naturally in the surface layer of the first layer of the aluminum film (3) imparts the effect for preventing the diffusion, since the peak for oxygen is found in an interface between the first layer of the aluminum film (3) and the plasma CVD nitride film (4). After forming the first layer of the aluminum film (3), the aluminum layer is exposed to the atmosphere whereby the aluminum reacts with oxygen in the atmosphere to form the alumina layer. On the other hand, the second layer of the aluminum film (6) is formed by a vacuum metal vapor deposition in the formation. Therefore oxygen is not incorporated in the interface between the second layer and the plasma CVD nitride film. This is the reason why the diffusion is resulted. The diffused layer reaches to the first film of the aluminum film (3) to cause the short-circuit.

SUMMARY OF THE INVENTION

The present invention is to overcome the above-described disadvantages and to provide a process for preparing a semiconductor device especially for a multi-layer wiring film for LSI, which has not a defect for short-circuit caused by diffusing aluminum into a plasma CVD nitride film.

In accordance with the present invention, the diffusion of aluminum into the plasma CVD nitride film by forming alumina layer in an interface between an aluminum film and the plasma CVD nitride film by absorbing or adsorbing oxygen in the surface layer of the plasma CVD nitride film before forming the aluminum film on the plasma CVD nitride film. The nitride film is formed on a main surface of a semiconductor substrate by a plasma chemical vapor deposition process and then, an oxygen-containing layer is formed on the surface of the nitride film and then, the aluminum-containing film is formed on the oxygen-containing layer.

DETAILED DESCRIPTION OF THE PREFERRED EMBODIMENTS

Figure 1:
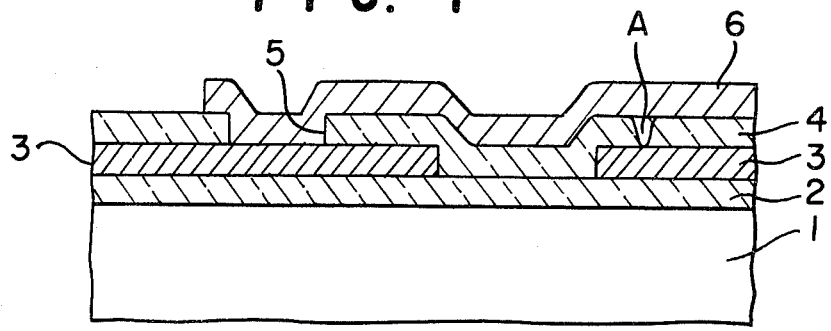
FIG. 1 is a sectional view showing only a wiring part of the two layer wiring in the conventional LSI after forming a pattern.
Figure 2:
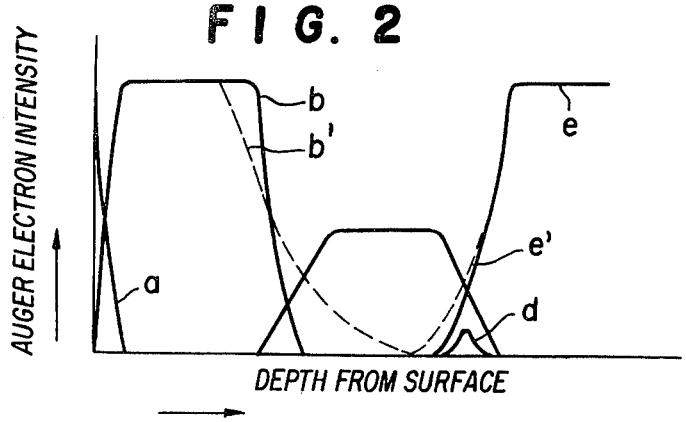
FIG. 2 is a graph showing variations of distributions of elements in the sample of FIG. 1, to the depth direction before and after the heat-treatment.
Figure 3:
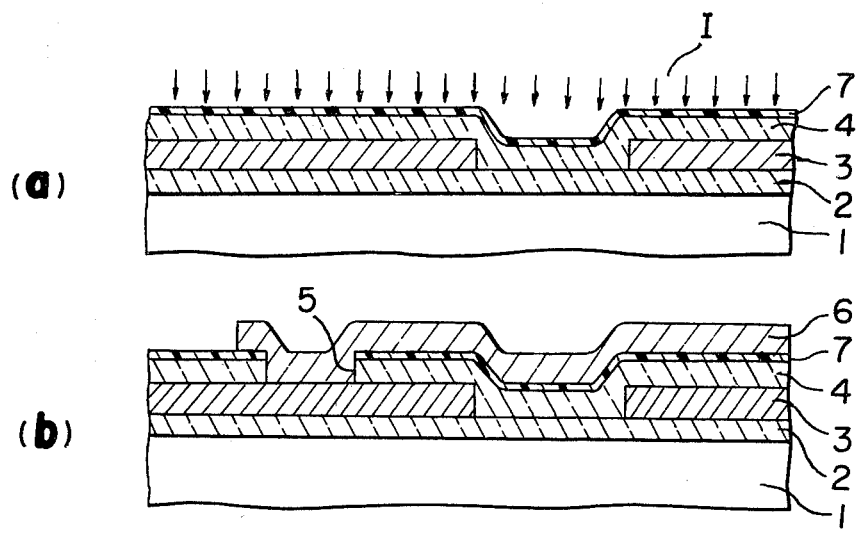
FIGS. 3(a) and (b) are respectively sectional views in steps of a preparation of the two layer wiring of the semiconductor device as one embodiment of the present invention.

FIGS. 3(a) and (b) are respectively the sectional view showing steps of the preparation as one embodiment of the present invention.

The plasma CVD nitride film (4) is formed on the first layer of the aluminum wiring film (3) by the conventional process. As shown in FIG. 3(a) by the arrow line I, $O_2$ ion is doped into the surface layer of the plasma CVD nitride film (4) to form the $O_2$-containing layer 7. As shown in FIG. 3(b), an opening part for the through-hole (5) is formed in a part of the plasma CVD nitride film (4) including the $O_2$-containing layer (7) by a conventional photo-engraving process, so as to expose a part of the first layer of the aluminum wiring film (3). The second layer of the aluminum wiring film (6) is formed on the $O_2$-containing layer (7). Therefore, the $O_2$-containing layer (7) is formed in the interface between the second layer of the aluminum wiring film (6) and the plasma CVD nitride film (4) whereby an alumina layer is naturally formed in the interface whereby the same effect as that of the interface between the first layer of the aluminum wiring film (3) and the plasma CVD nitride film (4) is imparted and the reaction of the aluminum in the second layer of the aluminum wiring film (6) with the plasma CVD nitride film (4) is not resulted to prevent the short-circuit of the second layer of the aluminum wiring film (6) and the first layer of the aluminum wiring film (3).

The doping of $O_2$ ion can be carried out after forming the opening for the through-hole (5) in the plasma CVD nitride membrane (4).

The application for the multi-layer wiring of LSI has been illustrated. The present invention can be also applied for other semiconductor devices having the plasma CVD nitride film on which an aluminum type electric conductive film is formed, whereby it is effective for maintaining the insulation of the plasma CVD nitride film to the lower layer. The process of the present invention can be applied not only to the electric conductive film made of aluminum but also other films made of an aluminum alloy with silicon, copper, manganese or antimony such as Al-Si; Al-Cu; Al-Si-Cu; Al-Mn or Al-Sb. The aluminum-containing film can be used.

The ion doping process has been applied for doping $O_2$ into the surface layer of the plasma CVD nitride film. It is also possible to employ the other processes such as a heat-treatment in an oxygen atmosphere; a process for dipping into an oxidizing agent such as water and hydrogen peroxide. Any process for forming the oxygen-containing layer in the surface of the plasma CVD nitride film by any adsorption or absorption of oxygen.

As described above, in accordance with the process of the present invention, in the formation of the aluminum or aluminum alloy film on the plasma CVD nitride film, the oxygen-containing layer is formed on the surface of the plasma CVD nitride film by the absorption or adsorption of $O_2$ whereby alumina layer is formed in the interface between the aluminum or aluminum alloy film and the plasma CVD nitride film and the reaction of the aluminum or aluminum alloy with the plasma CVD nitride film is prevented to maintain the insulation of the substrate under the plasma CVD nitride film.

We claim:
1. A process for preparing a semiconductor device, comprising:
   forming a first aluminum-containing wiring layer on a main surface of a semiconductor substrate;
   forming a nitride film on said electric conductive layer by a chemical vapor deposition;
   forming an oxygen-containing layer on the entire surface of said nitride film to prevent reaction of said nitride film with a second aluminum-containing wiring film to be subsequently applied to the oxygen-containing layer; and
   forming a second aluminum-containing film on and in contact with said oxygen-containing layer, said oxygen-containing layer preventing short-circuiting of the first and second aluminum-containing wiring layers through the nitride film.

2. The process for preparing a semiconductor device according to claim 1 wherein said aluminum-containing film is made of aluminum.

3. The process for preparing a semiconductor device according to claim 1 wherein said oxygen-containing film is formed by doping oxygen ion.

4. A process for preparing a semiconductor device, comprising:
   forming a first aluminum-containing wiring layer on a main surface of a semiconductor substrate;
   forming a nitride film on said first aluminum-containing wiring layer by a chemical vapor deposition;
   forming an oxygen-containing layer on the entire surface of said nitride film to prevent reaction of said nitride film with a second aluminum-containing wiring film to be subsequently applied to the oxygen-containing layer;
   exposing a part of said first aluminum-containing wiring layer beneath said nitride film and said oxygen-containing layer, said oxygen-containing layer continuing to cover the entire nitride film remaining after exposing said part of said electric conductive film; and
   forming a second aluminum-containing wiring layer on and in contact with said residual oxygen-containing layer and said exposed electric conductive film, said oxygen-containing layer preventing short-circuiting of the first and second aluminum-containing wiring layers through the nitride film.

5. The process for preparing a semiconductor device according to claim 4 wherein said aluminum-containing film is made of aluminum.

6. The process for preparing a semiconductor device according to claim 4 wherein said oxygen-containing film is formed by doping oxygen ion.

* * * * *